United States Patent

Usami

[19]

[11] Patent Number: 6,077,574
[45] Date of Patent: *Jun. 20, 2000

[54] PLASMA CVD PROCESS FOR FORMING A FLUORINE-DOPED $SiO_2$ DIELECTRIC FILM

[75] Inventor: Tatsuya Usami, Toyko, Japan

[73] Assignee: NEC Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/912,468

[22] Filed: Aug. 18, 1997

[30] Foreign Application Priority Data

Aug. 16, 1996 [JP] Japan ................................ 8-216286

[51] Int. Cl.⁷ ....................................... H05H 1/24
[52] U.S. Cl. ..................... 427/579; 427/578; 427/575; 427/577; 427/571; 427/225.393
[58] Field of Search ................... 427/579, 578, 427/255.393, 575, 577, 571; 438/787, 788

[56] References Cited

U.S. PATENT DOCUMENTS

| | | | |
|---|---|---|---|
| 4,968,384 | 11/1990 | Asano | 156/643 |
| 5,563,105 | 10/1996 | Dobuzinsky et al. | 437/240 |
| 5,571,576 | 11/1996 | Qian et al. | 427/574 |
| 5,571,578 | 11/1996 | Kaji et al. | 427/579 |

FOREIGN PATENT DOCUMENTS

| | | | |
|---|---|---|---|
| 0599730 | 11/1993 | European Pat. Off. | H01L 21/316 |
| 6-507942 | 9/1994 | Japan | C23C 16/40 |
| 7-90589 | 4/1995 | Japan | C23C 16/40 |
| 8-83842 | 3/1996 | Japan | H01L 21/768 |
| 9-148323 | 6/1997 | Japan | H01L 21/316 |

OTHER PUBLICATIONS

Katsumata et al; "Imrpovement in Hygroscopicity of PE–CVD F–doped SiO2"; 1995; pp. 269–274; Dry Process Symposium.

Hayasaka et al; "High–Quality and Low Dielectric Constant SiO2 CVD Using High Density PLasma"; 1993; pp. 163–168; Dry Process Symposium.

Fukada et al; Preparation of SiOF Films with Low Dielectric Constant By ECR Plasma CVD; pp. 43–49; Feb. 1995; DUMIC Conference.

Fukada et al; "Preparation of SiOF Films with Low Dielectric Constant by ECR Plasma Chemical Vapor Deposition"; 1993; pp. 158–160; Extended Abstracts of the 1993 International Conference on Solid State Devices and Materials.

Hayasaka et al; "Fluorine Doped SiO2 for Low Dielectric Constant Films in Sub–Half Micron ULSI Multilevel Interconnection"; 1995; pp. 157–159; Extended Abstracts of the 1995 International Conference on Solid State Devices and Materials.

*Primary Examiner*—Roy V. King
*Attorney, Agent, or Firm*—Hayes, Soloway, Hennessey, Grossman & Hage, P.C.

[57] ABSTRACT

In a process for forming a plasma CVD fluorine-doped $SiO_2$ dielectric film, a feed gas to be supplied to a plasma CVD apparatus is composed to include not only $SiH_4$ gas, $O_2$ gas, $CF_4$ gas and Ar gas but also $CO_2$ gas, and the amount of carbon and the amount of fluorine included in the feed gas are controlled independently of each other, to form a plasma CVD silicon-based $SiO_2$ dielectric film doped with fluorine in the concentration range of $4.0 \times 10^{21}$ atoms/cc to $1.0 \times 10^{22}$ atoms/cc, and carbon in the concentration range of $3.0 \times 10^{19}$ atoms/cc to $1.0 \times 10^{21}$ atoms/cc. Thus, a plasma CVD silicon-based $SiO_2$ dielectric film having a low dielectric constant and a sufficient "resistance to moisture" is obtained.

16 Claims, 5 Drawing Sheets

PLASMA CVD PROCESS FOR FORMING A FLUORINE-DOPED SIO$_2$ DIELECTRIC FILM

BACKGROUND OF THE INVENTION

1. Field of the Invention

The present invention relates to a plasma CVD interlayer dielectric film formed between wiring conductor layers in a semiconductor device, and a process for forming the same.

2. Description of Related Art

Recently, there have been advances in micro-fabrication of semiconductor integrated circuits. In particular, the tread is to multilevel interconnections in a logic integrated circuit. If spacing between adjacent metal wiring conductors in the multilevel interconnection becomes small, capacitance between the adjacent metal wiring conductors becomes large, with the result that various disadvantages occur. For example, the speed of an electric signal drops, and cross talk (imparting influence to another signal as noise) occurs.

One countermeasure is to form an interlayer dielectric film of an insulating material having a low dielectric constant. Recently, there has been reported to lower the specific dielectric constant from the order of 4.5 to the order to 2.8 to 4.3, by changing a plasma silicon oxide film (called a "P-SiO$_2$ film" hereinafter) which was used in the prior art and which was formed in a plasma chemical vapor deposition (called a "P-CVD process" hereinafter), to a fluorine containing plasma silicon oxide film (called a "P-SiOF film" hereinafter).

The dielectric constant can be lowered by increasing the fluorine concentration in the P-SiOF film. However, if the fluorine concentration becomes too large, "resistance to moisture" (or "resistance to water absorption") is deteriorated. Therefore, at a fluorine concentration which does not deteriorate the "resistance to moisture", the dielectric constant cannot be so lowered (for example, dielectric constant on the order of 3.3). This is reported by N. HAYASAKA et al, "Fluorine Doped SiO$_2$ for Low Dielectric Constant Films in Sub-Half Micron ULSI Multilevel Interconnection", 1995 International Conference on Solid State Devices and Materials, pages 157–159, the content of which is incorporated by reference in its entirety into this application.

In the case of forming a P-SiOF film in a semiconductor device, planarization is indispensable. In chemical mechanical polishing (called a "CMP") used for planarizing the P-SiOF film, since a polishing liquid is used, insufficient "resistance to moisture" becomes a difficult problem. Therefore, when the CMP process is used for planarization, there is no means other than to lower the fluorine concentration thereby to resultantly increase the dielectric constant.

Figure 1:
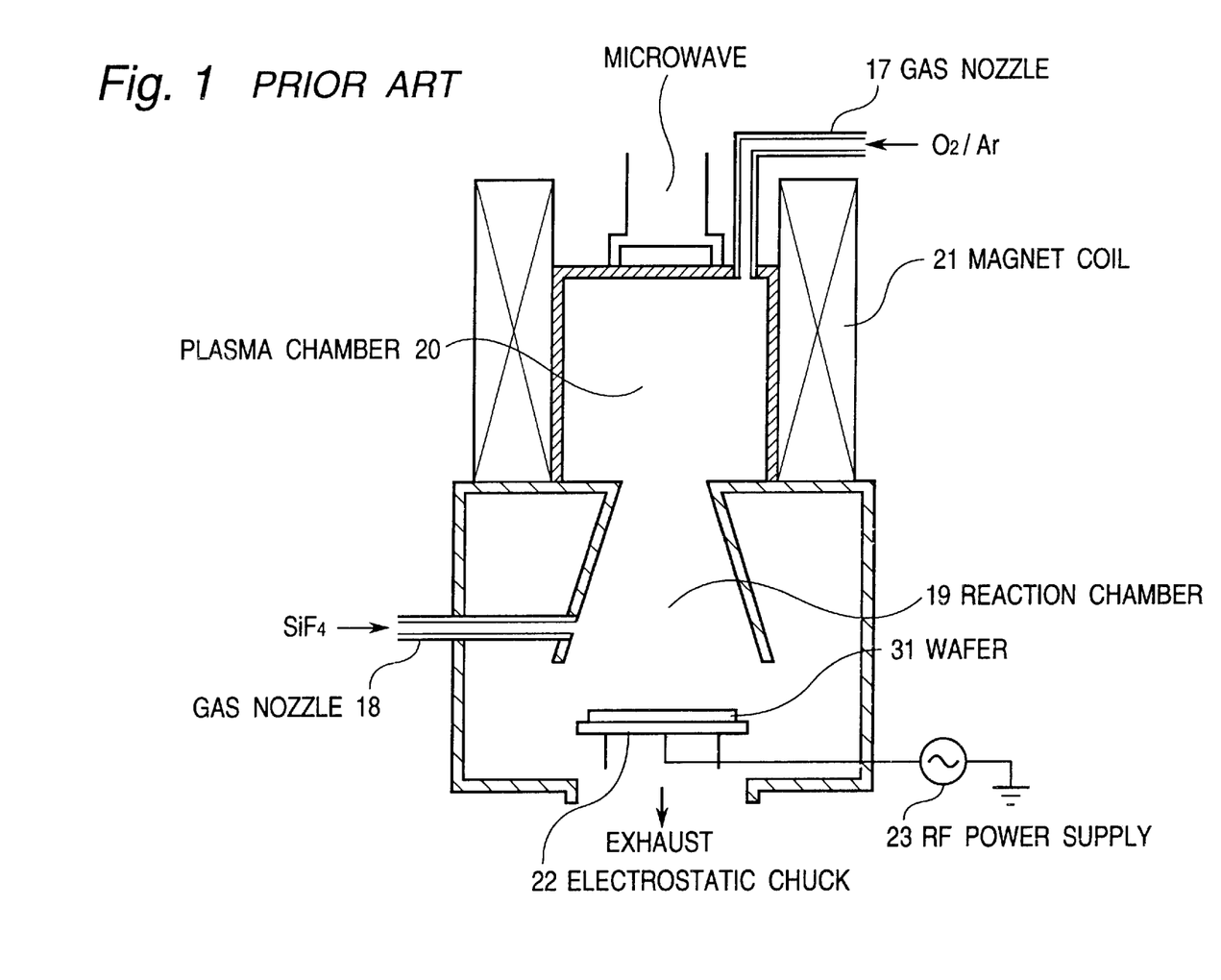
FIG. 1 is a diagrammatic sectional view of a plasma CVD apparatus for illustrating one example of the process for forming the prior art plasma CVD dielectric film.

Referring to FIG. 1, there is shown a diagrammatic sectional view of a plasma CVD apparatus for illustrating one example of the process for forming the prior art plasma CVD dielectric film. This example of the prior art process for forming a P-SiOF film (which is one kind of plasma CVD dielectric film), is described in, for example, T. FUKADA et al, "Preparation of SiOF Films with Low Dielectric Constant by ECR Plasma Chemical Vapor Deposition". 1993 International Conference on Solid State Devices and Materials, pages 158–160, the content of which is incorporated by reference in its entirety into this application.

In order to form a P-SiOF film, first, as material gases, O$_2$ gas and Ar gas are supplied through a gas nozzle 17 into a plasma chamber 20, and on the other hand, SiF$_4$ gas is supplied through a gas nozzle 18 into a reaction chamber 19 communicating with the plasma chamber 20. Then, in cooperation of a microwave introduced into the plasma chamber 20 and a magnetic field generated by a magnet coil 21 surrounding the plasma chamber 20, an electron cyclotron resonance (ECR) plasma is created, so that the introduced gases are activated. Thus, a P-SiOF film having excellent step coverage property is formed on a wafer 31 held on an electrostatic chuck 22 supplied with a RF bias voltage from a RF power supply 23.

The film thus formed is constituted of Si (silicon), F (fluorine) and O (oxygen), and the fluorine concentration is controlled by means of the flow rate of the SiF$_4$ gas, namely, the SiF$_4$ gas flow ratio (SiF$_4$/O$_2$). However, in the SiF$_4$ gas, Si and F cannot be controlled independently of each other, and therefore, it is not possible to form a P-SiOF film having a satisfactory low fluorine concentration, and therefore, in an actually formed P-SiOF film, "resistance to moisture" is not sufficient.

As a countermeasure for the above problem, there has been proposed to add SiH$_4$ gas so as to control F independently of Si, thereby to form a P-SiOF film having a relatively low fluorine concentration.

This is reported by T. FUKADA et al, "PREPARATION OF SiOF FILMS WITH LOW DIELECTRIC CONSTANT BY ECR PLASMA CVD", 1995 DUMIC Conference, Pages 43–49, the content of which is incorporated by reference in its entirety into this application.

However, in this proposed process, it is considered that not only Si, F and O but also H (hydrogen) are included in the film, so that the possibility of formation of Si-OH and H-OH increases, which act as hygroscopic or moisture absorbing sites, with the result that "resistance to moisture" is deteriorated. In other words, it is very difficult to determine an optimum condition which resultantly gives a satisfactory "resistance to moisture".

Figure 2:
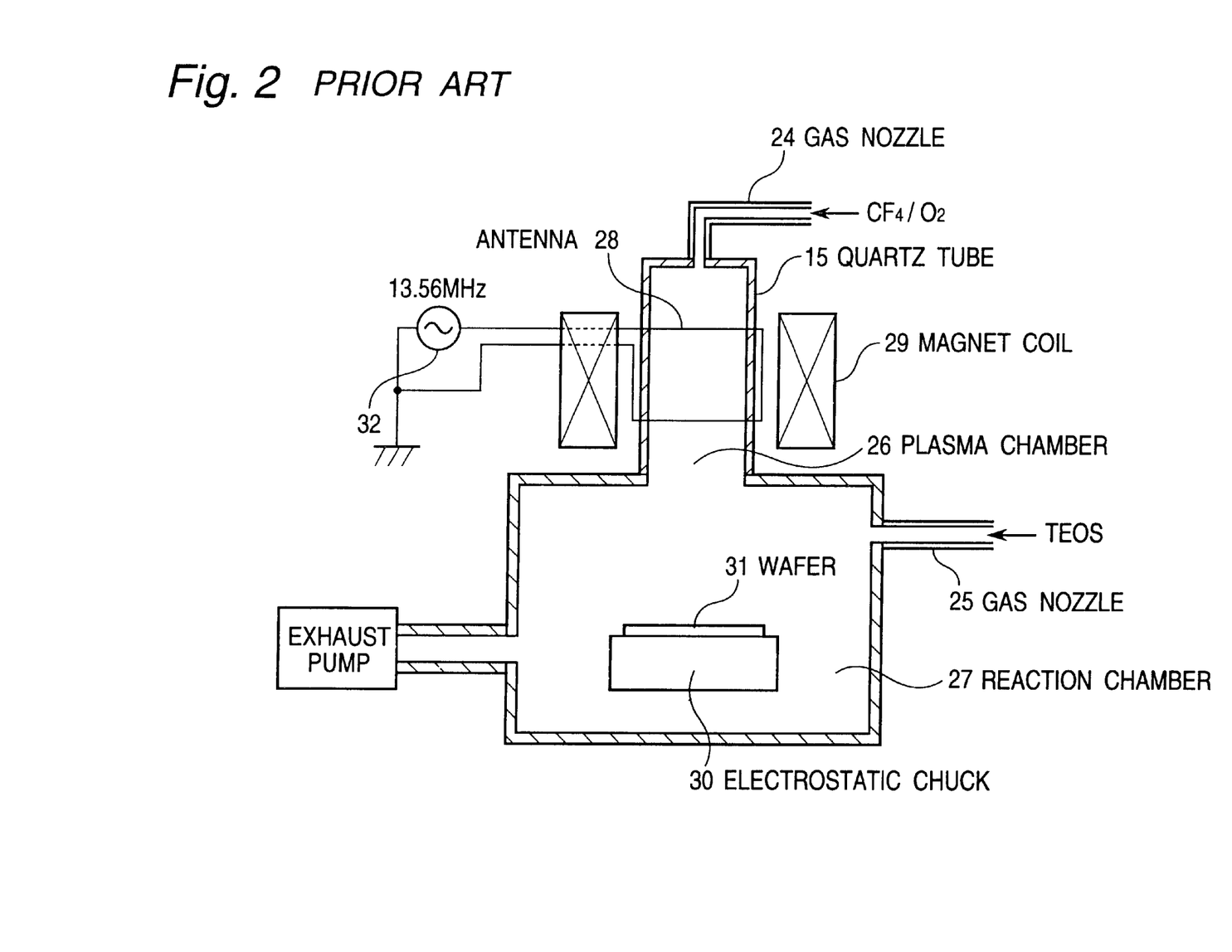
FIG. 2 is a diagrammatic sectional view of another plasma CVD apparatus for illustrating another example of the process for forming the prior art plasma CVD dielectric film.

Referring to FIG. 2, there is shown a diagrammatic sectional view of a plasma CVD apparatus for illustrating a second example of a process for forming a prior art plasma CVD dielectric film. This second example of the prior art process for forming the P-SiOF film is described in N. HAYASAKA et al, "High-Quality and Low Dielectric Constant SiO$_2$ CVD Using High Density Plasma", 1993 Dry Process Symposium, pages 162–168, the content of which is incorporated by reference in its entirety into this application.

In this second prior art process, as show in FIG. 2, as material gases, CF$_4$ gas and O$_2$ gas are supplied through a gas nozzle 24 into a plasma chamber 26 formed by a quartz tube 15 which is transparent to an electromagnetic wave, and a TEOS (tetraethoxysilane) gas is supplied through a gas nozzle 25 into a reaction chamber 27. Due to the combination of a magnet coil 29 surrounding the plasma chamber 26 and an antenna 28 also surrounding the plasma chamber 26 and driven with a 13.56 MHz RF source 32, a helicon plasma is generated and the gas is activated. Thus, a film is formed on a wafer 31 held on an electrostatic chuck 30.

In the above mentioned second prior art process, no RF bias is applied. An example of applying an RF bias is disclosed by R. KATSUMATA et al, "Improvement in Hygroscopicity of PE-CVD F-doped SiO$_2$", 1995 Dry Process Symposium, pages 269–274, the content of which is incorporated by reference in its entirety into this application. The film formed in this process is constituted of Si, F, H, C (carbon), and O, but the fluorine concentration is controlled by the flow rate of the CF$_4$ gas and the ratio of the CF$_4$ gas to other gases. However, since C and F cannot be controlled independently of each other, a P-SiOF film having satisfactory "resistance to moisture" cannot be obtained.

In the above mentioned prior art dielectric films and the prior art processes for forming the same, because Si and F cannot be controlled independently of each other, as in the $SiF_4/O_2/Ar$ gas supply system, or because C and F cannot be controlled independently of each other, as in the $SiH_4/O_2/Ar/CF_4$ gas supply system, it is not possible to obtain a dielectric film having not only a low dielectric constant and satisfactory "resistance to moisture" but also excellent "resistance to heat". Why this desired dielectric film cannot be obtained will be discussed specifically in the following:

First, carbon has a property of elevating the "resistance to moisture", but if the film contains excess carbon, the "resistance to heat" is deteriorated. For example, if the carbon concentration is $1 \times 10^{22}$ atoms/cc or more, in the prior art example in which $CO_2$ is used in place of $O_2$, for example, in an example formed by using an $SiH_4/CO_2/Ar/CF_4$ gas supply system, the obtained film is not resistant to a heat treatment of 400° C., and the dielectric constant becomes high.

If the above mentioned control was not conducted, since carbon is short in the gas supply system, when a film is formed by using for example the $SiH_4/O_2/Ar/CF_4$ gas supply system which doesn't permit one to control C and F independently of each other, the fluorine concentration becomes higher than the carbon concentration in the obtained film, with the result that the obtained film can have only a deteriorated "resistance to moisture".

SUMMARY OF THE INVENTION

Accordingly, it is an object of the present invention to overcome the above mentioned defect of the prior art.

Another object of the present invention is to provide a dielectric film having a low dielectric constant and satisfactory "resistance to moisture".

Still another object of the present invention is to provide a silicon based dielectric film containing fluorine and carbon, which has a low dielectric constant and "resistance to moisture" and "resistance to heat" enough to give reliability.

A further object of the present invention is to provide a process for forming a silicon based dielectric film containing fluorine and carbon, which has a low dielectric constant and "resistance to moisture" and "resistance to heat" enough to give reliability.

The above and other objects of the present invention are achieved in accordance with the present invention by a plasma CVD dielectric film containing silicon as a basic material, fluorine in a concentration range of $4.0 \times 10^{21}$ atoms/cc to $1.0 \times 10^{22}$ atoms/cc, and carbon in a concentration range of $3.0 \times 10^{19}$ atoms/cc to $1.0 \times 10^{21}$ atoms/cc.

According to another aspect of the present invention, there is provided a process for forming a plasma CVD dielectric film, comprising the step of supplying a material gas composed of a silicon hydride gas, an oxygen gas, a fluorocarbon gas, an argon gas and a carbon oxide gas, into a chamber, and generating a plasma in the chamber to activate the gases, so as to form a plasma CVD dielectric film containing silicon as a basic material, fluorine in a concentration range of $4.0 \times 10^{21}$ atoms/cc to $1.0 \times 10^{22}$ atoms/cc, and carbon in a concentration range of $3.0 \times 10^{19}$ atoms/cc to $1.0 \times 10^{21}$ atoms/cc, on a semiconductor substrate located in the chamber.

According to a third aspect of the present invention, there is provided a process for forming a plasma CVD dielectric film, comprising the step of supplying a material gas composed of a silicon fluoride gas, an oxygen gas, an argon gas and a carbon oxide gas, into a chamber, and generating a plasma in the chamber to activate the gases, so as to form a plasma CVD dielectric film containing silicon as a basic material, fluorine in a concentration range of $4.0 \times 10^{21}$ atoms/cc to $1.0 \times 10^{22}$ atoms/cc, and carbon in the concentration range of $3.0 \times 10^{19}$ atoms/cc to $1.0 \times 10^{21}$ atoms/cc, on a semiconductor substrate located in the chamber.

In the above mentioned processes, the argon gas can be omitted. In addition, hydrocarbon gas can be substituted for the carbon oxide gas. Furthermore, it is preferred to control the flow rate of the gas containing fluorine and the flow rate of the gas containing carbon, independently of each other.

Specifically, the silicon hydride gas can be one selected from the group consisting of $SiH_4$, $Si_2H_6$ (which are generalized by $Si_nH_{2n+2}$), TEOS, $SiH_2Cl_2$, or a combination of at least two of the aforesaid gases. The fluorocarbon gas can be one selected from the group consisting of $CF_4$, $C_2F_6$, $CHF_3$, $C_4F_8$, or a combination of at least two of the aforesaid gases. The silicon fluoride gas can be one selected from the group consisting of $SiF_4$, TEFS (trisethoxyfluorosilane) and a fluorine containing organic silicon compound, or a combination of at least two of the aforesaid gases.

Alternatively, when hydrocarbon gas is used in place of the carbon oxide gas, the hydrocarbon gas can be one selected from the group consisting of $C_2H_2$, $CH_4$, $C_2H_6$, $C_3H_8$. In this case, similarly, the silicon hydride gas can be one selected from the group consisting of $SiH_4$, $Si_2H_6$, TEOS, $SiH_2Cl_2$, or a combination of at least two of the aforesaid gases. The fluorocarbon gas can be one selected from the group consisting $CF_4$, $C_2F_6$, $CHF_3$, $C_4F_8$, or a combination of at least two of the aforesaid gases. The silicon fluoride gas can be one selected from the group consisting of $SiF_4$, TEFS and a fluorine containing organic silicon compound, or a combination of at least two of the aforesaid gases.

Furthermore, the silicon hydride gas can be added to the silicon fluoride gas, the oxygen gas, the argon gas and the carbon oxide gas. In this case, the silicon hydride gas can be one selected from the group consisting $SiH_4$, $Si_2H_6$, TEOS, $SiH_2Cl_2$, or a combination of at least two of the aforesaid gases.

On the other hand, a plasma source for generating the above mentioned plasma is preferred to be a source for generating a high density plasma such as an electron cyclotron resonance plasma, an inductive coupling type plasma, and a helicon plasma.

The above and other objects, features and advantages of the present invention will be apparent from the following description of preferred embodiments of the invention with reference to the accompanying drawings.

DESCRIPTION OF THE PREFERRED EMBODIMENTS

Figure 3:
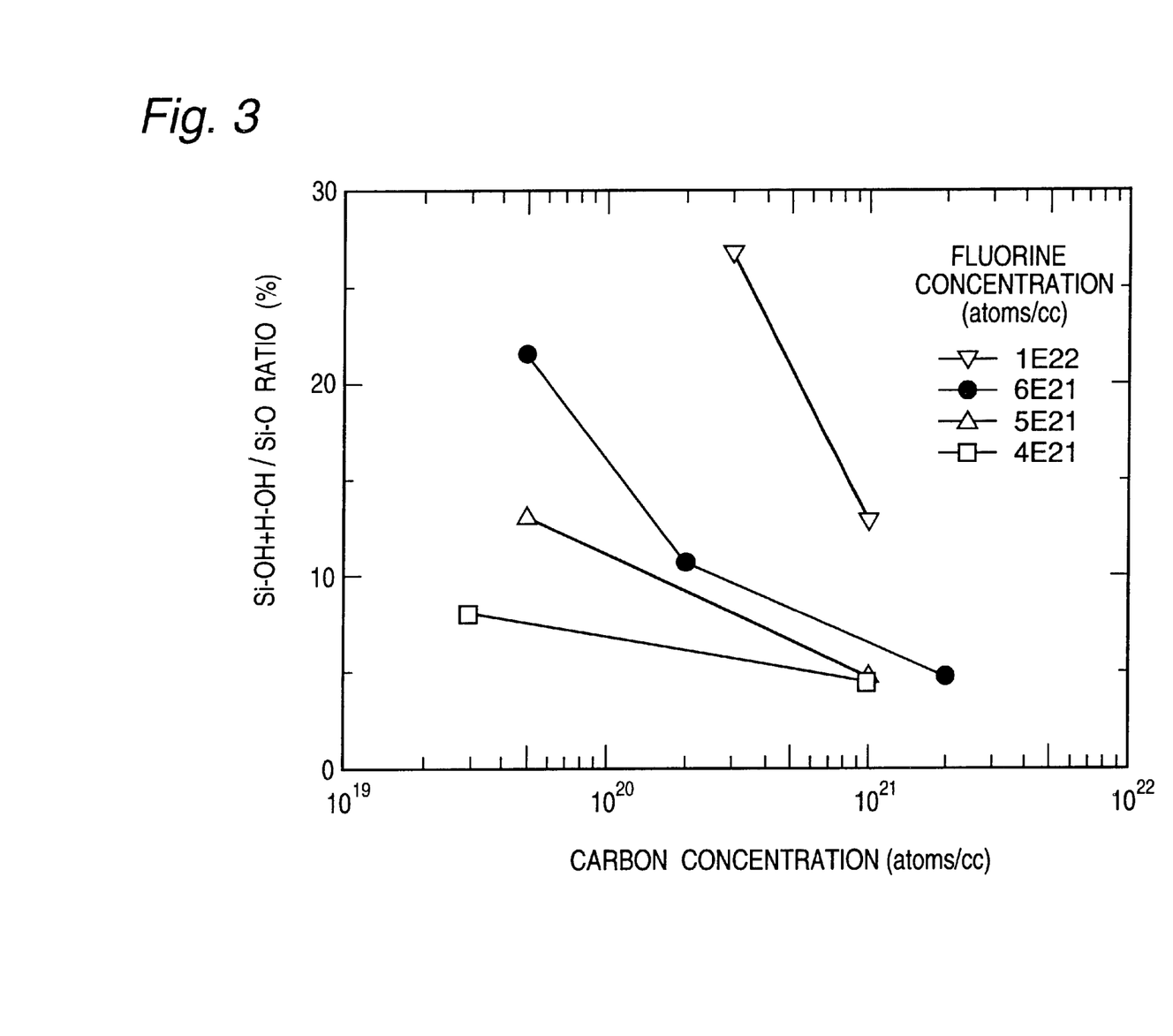
FIG. 3 is a graph showing the relation between fluorine concentration, carbon concentration and "resistance to moisture", for illustrating a plasma CVD dielectric film in accordance with the present invention.

Referring to FIG. 3, there is shown a graph showing the relation between fluorine concentration, carbon concentration and "resistance to moisture", for illustrating a plasma CVD dielectric film in accordance with the present invention.

The graph of FIG. 3 shows the result of experiments conducted by the inventor, concerning the relation between fluorine concentration, carbon concentration and the "resistance to moisture".

As shown in FIG. 3, as fluorine concentration increases, "resistance to moisture" deteriorates. For example, a SiOF film formed to have a fluorine concentration of $1.0 \times 10^{22}$ atoms/cc showed a Si-OH+O-OH absorption of 27% (arbitrary unit) when it was measured by an FT-IR (Fourier Transform infrared spectroscopy) technique after a PCT (pressure cooker test) was performed for 100 hours. Si-OH+O-OH absorption is one parameter indicating a moisture absorption property. On the other hand, if the carbon concentration increases, "resistance to moisture" was improved. For example, in the FT-IR measurement, a SiOF film formed to have a carbon concentration of about $1.0 \times 10^{21}$ atoms/cc showed a Si-OH+O-OH absorption of 13% (arbitrary unit), which is better than a PE-TEOS (plasma enhanced tetraethoxysilane) film. However, as regards "resistance to heat", it was confirmed that if the carbon concentration reaches $1.0 \times 10^{21}$ atoms/cc, the formed SiOF film changes its film quality with a heat treatment of 400° C., so that the dielectric constant becomes high.

From the above mentioned result of the experiments, the inventor concluded that if F, C, O and Si in the introduced feed gases can be controlled independently of each other, it is possible to obtain a plasma CVD fluorine-doped silicon oxide film having a desired dielectric constant, a desired high "resistance to moisture" and a desired "resistance to heat". The inventor conducted various experiments of the dielectric constant and a "resistance to moisture", by forming a plasma CVD fluorine-doped silicon oxide film while preparing various combinations of feed gases and changing the gas flow rate of respective feed gases, for the purpose of determining fluorine concentration and carbon concentration which cause the fluorine-doped silicon oxide film to have excellent dielectric constant, "resistance to moisture" and "resistance to heat". As a result, the inventor discovered that, for obtaining a fluorine-doped silicon oxide film having excellent dielectric constant, "resistance to moisture" and "resistance to heat", the fluorine concentration should be in the range of $4.0 \times 10^{21}$ atoms/cc to $1.0 \times 10^{22}$ atoms/cc, and the carbon concentration should be in the range of $3.0 \times 10^{19}$ atoms/cc to $1.0 \times 10^{21}$ atoms/cc.

Figure 4:
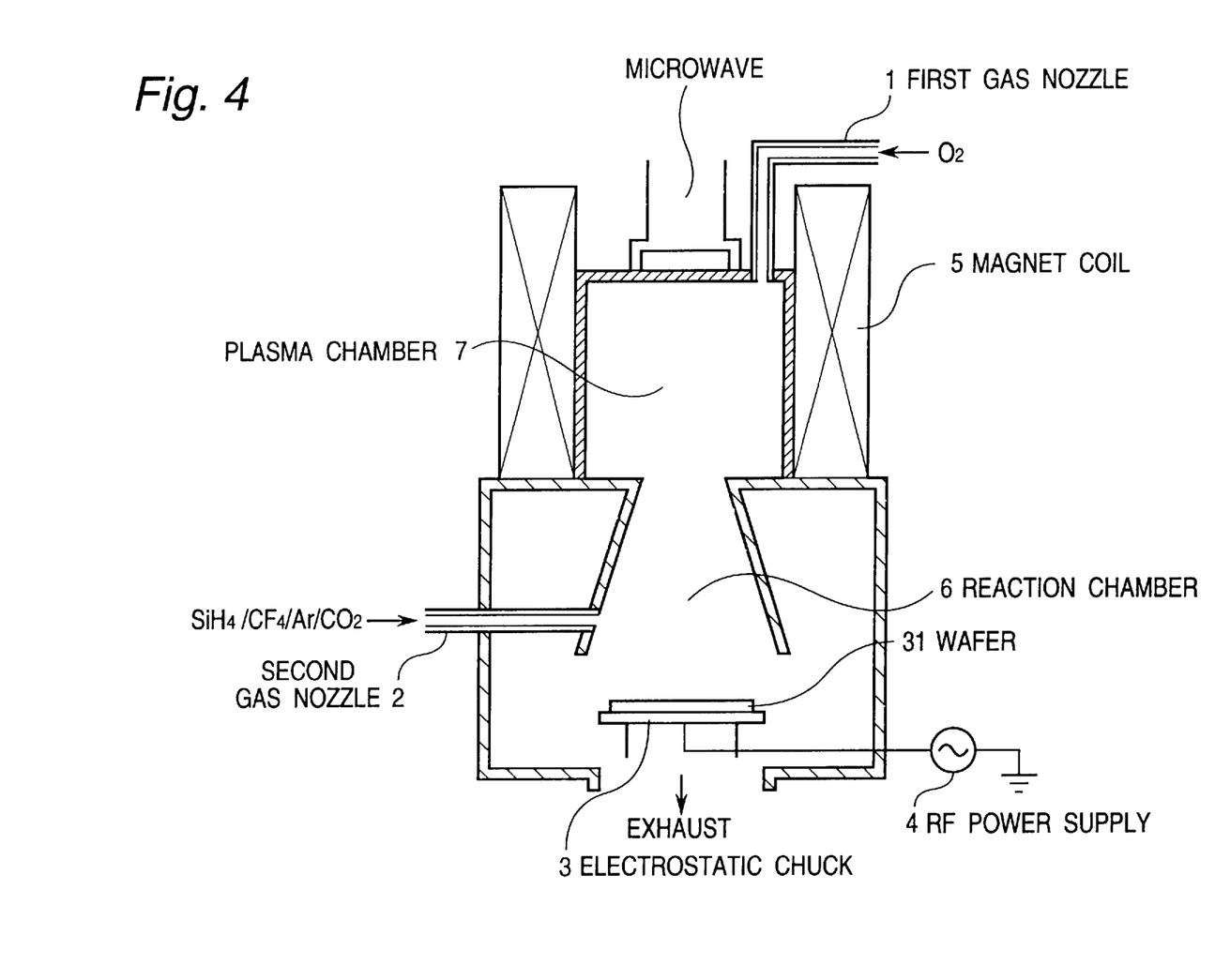
FIG. 4 is a diagrammatic sectional view of a plasma CVD apparatus for illustrating a first embodiment of the process in accordance with the present invention for forming a plasma CVD dielectric film in accordance with the present invention.

Referring to FIG. 4, there is shown a diagrammatic sectional view of a plasma CVD apparatus for illustrating a first embodiment of the process in accordance with a present invention for forming the plasma CVD dielectric film in accordance with the present invention. For the purpose of obtaining an oxide film having a low desired dielectric constant and a satisfactory "resistance to moisture", the P-SiOF dielectric film was formed by a RF-biased ECR-CVD process using a microwave ECR plasma CVD apparatus shown in FIG. 4.

First, in order to control F, C, O and Si independently of each other, the gas composition was made of $SiH_4/O_2/Ar/CF_4/CO_2$. $O_2$ is introduced with a flow rate of 75–100 sccm through a first gas nozzle 1 into a plasma chamber 7 surrounded by a magnet coil 5, while, $SiH_4$ of a flow rate of 40–50 sccm, $CF_4$ of a flow rate of 10–20 sccm, Ar of a flow rate of 0–100 sccm, and $CO_2$ of a flow rate of 5–10 sccm, are introduced through a second gas nozzle 2 into a reaction chamber 6 in communication with the plasma chamber 7. Microwave power of 2.45 GHz and 20 KW is introduced into the plasma chamber 7, so as to activate the gas, and the activated gas is supplied to the reaction chamber 6 by action of a magnetic field generated by the magnet coil 5. A P-SiOF film is deposited on a wafer 31 held on an electrostatic chuck 3 which is connected to a RF power supply 4 and which is biased with 1.0–1.5 KW.

In the P-SiOF film thus formed, the fluorine concentration is determined by the flow rate of $CF_4$, or the flow ratio $(O_2+CO_2)/SiH_4$, and the carbon concentration is determined by the flow rate of $CO_2+CF_4$. Namely, the fluorine concentration and the carbon concentration can be controlled independently of each other. By setting the gas flow rates, the microwave power and the RF power as mentioned above to produce a desired combination of fluorine concentration and carbon concentration, a fluorine concentration of $7.0 \times 10^{21}$ atoms/cc and the carbon concentration of $3.0 \times 10^{20}$ atoms/cc was obtained in the P-SiOF film.

In the above mentioned gas supplying system, therefore, it could be easily understood that, since the fluorine concentration and the carbon concentration can be controlled independently of each other by controlling the flow rate of the $CF_4$ gas concerning the fluorine concentration and by controlling the flow rate of the $CO_2+CF_4$ gas concerning the carbon concentration, it was possible to easily form a P-SiOF film having a fluorine concentration of $7.0 \times 10^{21}$ atoms/cc and a carbon concentration of $3.0 \times 10^{20}$ atoms/cc. As a result, there was obtained a plasma CVD F- and C-doped silicon oxide dielectric film having a low dielectric constant of 3.0, with "resistance to moisture" sufficient to resist CMP processing.

The wafer having a plasma CVD F- and C-doped silicon oxide dielectric film formed as mentioned above, was introduced into a heat treatment chamber, and an annealing treatment was conducted in an $N_2$ atmosphere at an annealing temperature of 400° C. for ten minutes. The "resistance to moisture" of the annealed plasma CVD F- and C-doped silicon oxide dielectric film was measured by FT-IR, again. Neither the Si-OH absorption nor the H-OH absorption changed. Furthermore, after the wafer was left for one month, the "resistance to moisture" of the plasma CVD F- and C-doped silicon oxide dielectric film was measured by FT-IR. The Si-OH absorption and the H-OH absorption did not change substantially.

The above mentioned experiment result shows that there was obtained a plasma CVD F- and C-doped silicon oxide dielectric film having a low dielectric constant of 3.0, "resistance to moisture" able to resist a CMP processing, and a satisfactory "resistance to heat".

Figure 5:
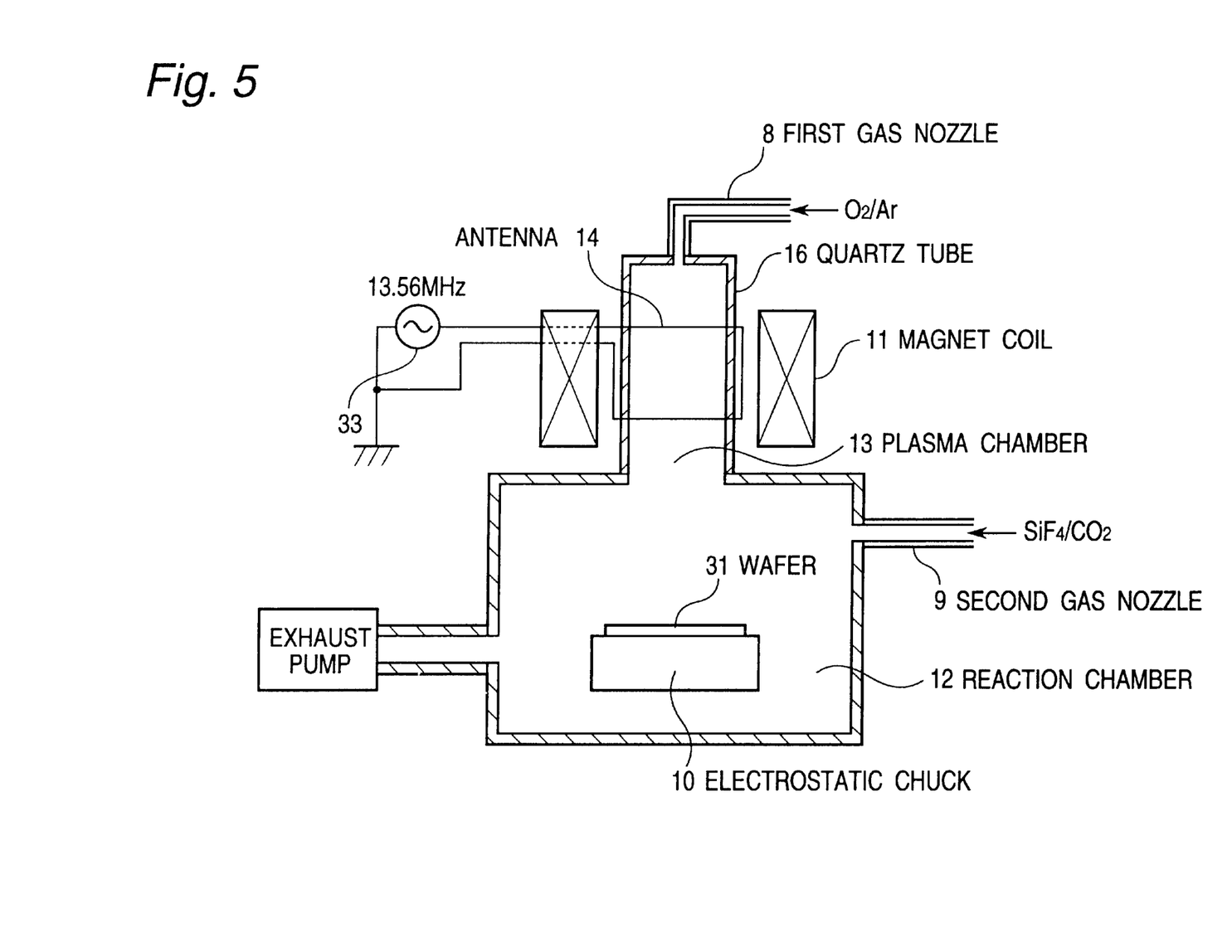
FIG. 5 is a diagrammatic sectional view of another plasma CVD apparatus for illustrating second embodiment of the process in accordance with the present invention for forming a plasma CVD dielectric film in accordance with the present invention.

Referring to FIG. 5, there is shown a diagrammatic sectional view of another plasma CVD apparatus for illustrating a second embodiment of the process in accordance with the present invention for forming a plasma CVD dielectric film in accordance with the present invention. For the purpose of obtaining a P-SiOF dielectric film having a low dielectric constant and a satisfactory "resistance to moisture", the P-SiOF film was formed by a helicon plasma CVD apparatus shown in FIG. 5, which is one kind of chemical vapor deposition apparatus.

In order to make it easy to control gas composition, the gas composition was made to $SiF_4/O_2/Ar/CO_2$. $O_2$ gas and Ar gas are supplied through a first gas nozzle 8 into a plasma chamber 13 formed of a quartz tube 16 and surrounded by a magnet coil 11 and an antenna 14 connected to a 13.56 MHz. RF source 33. $SiF_4$ gas and $CO_2$ gas are supplied through a second gas nozzle 9 into a reaction chamber 12. Due to the combination of a magnetic field generated by the magnet coil 11 and a helicon wave generated by the antenna 13 driven with the 13.56 MHz RF source 33, a plasma is generated and the gas is activated. Thus, a P-SiOF film is formed on a wafer 31 held on an electrostatic chuck 10 in the reaction chamber 12.

The fluorine concentration in the P-SiOF film thus formed is determined by the flow rate of the $SiF_4$ gas or the flow ratio of the $SiF_4$ gas to other gases $O_2+CO_2$. On the other hand, the carbon concentration in the P-SiOF film thus formed is determined by the flow rate of $CO_2$. Namely, the fluorine concentration and the carbon concentration can be controlled independently of each other. With this gas composition, there could be formed a P-SiOF film having a desired fluorine concentration and a desired carbon concentration, similarly to the first embodiment.

Gas combinations other than the above mentioned gas combinations can be considered. Now, variations including the above mentioned gas combinations will be described. In connection to the second embodiment, first, $SiF_4O_2/Ar/CO_2$ as mentioned above can be exemplified, and furthermore, $SiH_4$ can be added into $SiF_4O_2/Ar/CO_2$. In these two variations, $CO_2$ can be replaced with CO, or $C_2H_2$, $CH_4$, $C_2H_6$ or $C_3H_8$, or a combination of at least two selected from the group consisting of $C_2H_2$, $CH_4$, $C_2H_6$ and $C_3H_8$. In all the variations, Ar can be removed.

In connection to the first embodiment, first, $SiH_4/O_2/Ar/CF_4/CO_2$ as mentioned above can be exemplified, and $CO_2$ can be replaced with CO, or $C_2H_2$, $CH_4$, $C_2H_6$ or $C_3H_8$, or a combination of at least two selected from the group consisting of $C_2H_2$, $CH_4$, $C_2H_6$ and $C_3H_8$. In all the variations, Ar can be removed.

Furthermore, in all the above mentioned variations, $SiH_4$ can be replaced with TEOS, and $CF_4$ can be replaced with $C_2F_6$, $C_3F_8$, $C_4F_8$ or $CHF_3$. In addition, $SiF_4$ can be replaced with TEFS, FASi-4 (a fluorinated alkylsilane-4 such as, 1,2 bis [methyldifluorosilyl]ethane) or FASi-6 (a fluorinated alkylsilane-6 such as, 1,2 bis [trifluorosilyl]ethane).

In the above mentioned second embodiment, the Ar gas was introduced into the plasma chamber 13, but the Ar gas can be introduced into the reaction chamber 12. In addition, the $CF_4$ gas, the COx gas or the CxHy gas can be introduced into either the plasma chamber 13 or the reaction chamber 12. However, introduction to the reaction chamber 12 is preferable to introduction to the plasma chamber 13, since the introduction to the reaction chamber 12 can prevent contamination of the plasma chamber 13.

On the other hand, as regards the plasma generation source, it is possible to use a parallel plate-electrode CVD process using a single frequency of 13.56 MHz, a parallel plate-electrode CVD process using two frequencies of 13.56 MHz and 400 KHz, a ECR-CVD process using a high density plasma of 2.45 GHz, an ICP-CVD process which is an inductive coupling type plasma, a helicon CVD process, or a 13.56 MHz RF-biased helicon CVD process. However, a high density plasma CVD process such as ICP-CVD, ECR-CVD or helicon CVD is preferable.

As seen from the above, the process in accordance with the present invention is characterized by selecting feed gases which can easily control the fluorine concentration and the carbon concentration independently of each other, setting respective flow rates of the feed gases at suitable values which can realize a desired fluorine concentration and a desired carbon concentration, and activating the feed gases by plasma to form a P-SiOF film. The P-SiOF dielectric film thus formed having the desired fluorine concentration and the desired carbon concentration can be obtained. Therefore, a P-SiOF dielectric film having low dielectric constant, satisfactory "resistance to moisture", and excellent "resistance to heat" can be obtained.

If the dielectric film thus formed is used in a semiconductor integrated circuit in multilevel interconnection structure, crosstalk between wiring conductors can be prevented, and planarization based on CMP can be performed without problem.

The invention has thus been shown and described with reference to the specific embodiments. However, it should be noted that the present invention is in no way limited to the details of the illustrated structures but changes and modifications may be made within the scope of the appended claims.

What is claimed is:

1. A process for forming a plasma CVD silicon oxide dielectric film doped with fluorine and carbon, comprising the step of separately supplying a first feed gas composed of a silicon hydride gas, a fluorocarbon gas, and a carbon containing gas selected from the group consisting of carbon oxide gas and a hydrocarbon gas, and a second feed gas composed of a plasma activated oxygen gas into a reaction chamber, so as to form a plasma CVD silicon oxide dielectric film doped with fluorine in the concentration range of $4.0 \times 10^{21}$ atoms/cc to $1.0 \times 10^{22}$ atoms/cc, and carbon in the concentration range of $3.0 \times 10^{19}$ atoms/cc to $1.0 \times 10^{21}$ atoms/cc, on a substrate located in said chamber.

2. A process claimed in claim 1 wherein argon gas is added with said first feed gas.

3. A process claimed in claim 1 including the step of controlling the flow rate of said fluorocarbon gas and the flow rate of said carbon containing gas independently of each other.

4. A process claimed in claim 1 wherein said silicon hydride gas a gas selected from the group consisting of $SiH_4$, $Si_2H_6$, TEOS and $SiH_2Cl_2$, and a combination of at least two of said gases, and said fluorocarbon gas is a gas selected from the group consisting of $CF_4$, $C_2F_6$, $CHF_3$, $C_3F_8$ and $C_4F_8$ and $C_4F_8$, and a combination of at least two of said gases.

5. A process claimed in claim 4 wherein said hydrocarbon gas is a gas selected from the group consisting of $C_2H_2$, $CH_4$, $C_2H_6$ and $C_3H_8$, and a combination of at least two of said gases.

6. A process claimed in claim 1 wherein said plasma is a high density plasma which is one selected from the group consisting of an electron cyclotron resonance plasma, an inductive coupling type plasma and a helicon plasma.

7. A process claimed in claim 6 wherein a high frequency bias is applied to said substrate on which said plasma CVD silicon oxide dielectric film is to be formed.

8. A process for forming a plasma CVD silicon oxide dielectric film doped with fluorine and carbon, comprising the step of separately supplying a first feed gas composed of a silicon fluorine gas, and a carbon containing gas selected from the group consisting of a carbon oxide gas and a hydrocarbon gas, and a second feed gas composed of a plasma activated oxygen gas into a reaction chamber, so as to form a plasma CVD silicon oxide dielectric film doped with fluorine in the concentration range of $4.0 \times 10^{21}$ atoms/cc to $1.0 \times 10^{22}$ atoms/cc, and carbon in the concentration range of $3.0 \times 10^{19}$ atoms/cc to $1.0 \times 10^{21}$ atoms/cc, on a substrate located in the chamber.

9. A process claimed in claim 8 wherein argon gas is added with said second feed gas.

10. A process claimed in claim 8 including the step of controlling the flow rate of said silicon fluoride gas and the flow rate of said carbon containing gas independently of each other.

11. A process claimed in claim 8 wherein said silicon fluoride gas is a gas selected from the group consisting of $SiF_4$, TEFS, a fluorine containing organic silicon compound, and a combination of at least two of said gases.

12. A process claimed in claim 8 wherein an silicon hydride gas is added with said second feed gas.

13. A process claimed in claim 12 wherein said silicon fluoride gas is a gas selected from the group consisting of $SiF_4$, TEOS, a fluorine containing organic silicon compound, and a combination of at least two of said gases, and said silicon hydride gas is a gas selected from the group consisting of $SiH_4$, $Si_2H_6$, TEOS, $SiH_2Cl_2$, and a combination of at least two of said gases.

14. A process claimed in claim 13 wherein said hydrocarbon gas is a gas selected from the group consisting of $C_2H_2$, $CH_4$, $C_2H_6$, and $C_3H_8$, and a combination of at least two of said gases.

15. A process claimed in claim 8 wherein said plasma is a high density plasma which is one selected from the group consisting of an electron cyclotron resonance plasma, an inductive coupling type plasma and a helicon plasma.

16. A process claimed in claim 15 wherein a high frequency bias is applied to said substrate on which said plasma CVD silicon oxide dielectric film is to be formed.

* * * * *

UNITED STATES PATENT AND TRADEMARK OFFICE
CERTIFICATE OF CORRECTION

PATENT NO. : 6,077,574
DATED : JUNE 20, 2000
INVENTOR(S) : Tatsuya USAMI

It is certified that error appears in the above-identified patent and that said Letters Patent is hereby corrected as shown below:

Claim 4, column 8, line 49, after "hydride gas" insert --is--.

Signed and Sealed this

Fifth Day of June, 2001

Attest:

Attesting Officer

NICHOLAS P. GODICI
Acting Director of the United States Patent and Trademark Office